US011222930B2

(12) United States Patent
Yuan et al.

(10) Patent No.: US 11,222,930 B2
(45) Date of Patent: Jan. 11, 2022

(54) ARRAY SUBSTRATE AND DISPLAY PANEL

(71) Applicant: BOE Technology Group Co., Ltd., Beijing (CN)

(72) Inventors: Guangcai Yuan, Beijing (CN); Kang Guo, Beijing (CN); Xin Gu, Beijing (CN); Haixu Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/620,572

(22) PCT Filed: Jun. 12, 2019

(86) PCT No.: PCT/CN2019/090928
§ 371 (c)(1),
(2) Date: Dec. 9, 2019

(87) PCT Pub. No.: WO2020/057185
PCT Pub. Date: Mar. 26, 2020

(65) Prior Publication Data
US 2021/0057495 A1    Feb. 25, 2021

(51) Int. Cl.
*H01L 27/32* (2006.01)
*H01L 27/28* (2006.01)
(Continued)

(52) U.S. Cl.
CPC ........ *H01L 27/3227* (2013.01); *H01L 27/288* (2013.01); *H01L 27/3246* (2013.01);
(Continued)

(58) Field of Classification Search
CPC ............... H01L 27/3227; H01L 27/288; H01L 27/3246; H01L 27/323; H01L 51/0036;
(Continued)

(56) References Cited

U.S. PATENT DOCUMENTS

2013/0285046 A1* 10/2013 Yamazaki ......... H01L 27/14603
257/43
2015/0279884 A1* 10/2015 Kusumoto .......... H01L 27/1207
257/43
(Continued)

FOREIGN PATENT DOCUMENTS

CN    104201187 A    12/2014
CN    104752462 A     7/2015
(Continued)

OTHER PUBLICATIONS

First Chinese Office Action issued in Chinese Patent Application No. 201811086394.1 dated Dec. 20, 2019.

*Primary Examiner* — Bitew A Dinke
(74) *Attorney, Agent, or Firm* — Arent Fox LLP; Michael Fainberg

(57) ABSTRACT

An embodiment of the present disclosure provides an array substrate and a display panel. The array substrate includes a base substrate, organic electroluminescence components arranged on the base substrate in an array, and a photoelectric conversion component corresponding to each of the organic electroluminescence components. A luminescent spectrum of each organic electroluminescence component comprises a first waveband and a second waveband. The first waveband is determined by an emission peak of the luminescent spectrum, and is used to determine brightness and tone purity of light emitted by the organic electroluminescence component. The photoelectric conversion component is at least used to convert light of the second waveband emitted by a corresponding organic electroluminescence component into electric energy.

18 Claims, 8 Drawing Sheets

(51) Int. Cl.
    *H01L 51/00*     (2006.01)
    *H01L 51/42*     (2006.01)

(52) U.S. Cl.
    CPC ........ *H01L 27/323* (2013.01); *H01L 51/0036* (2013.01); *H01L 51/42* (2013.01)

(58) Field of Classification Search
    CPC . H01L 51/42; H01L 27/3276; H01L 27/3234; H01L 27/3216; H01L 27/3218; H01L 27/305; H01L 27/286; H01L 27/3244
    See application file for complete search history.

(56) References Cited

U.S. PATENT DOCUMENTS

| | | | |
|---|---|---|---|
| 2015/0364527 A1* | 12/2015 | Wang | H01L 27/3244 257/40 |
| 2016/0155782 A1* | 6/2016 | Sato | H01L 27/3246 257/82 |
| 2016/0293100 A1 | 10/2016 | Zhang et al. | |
| 2017/0357641 A1* | 12/2017 | Okamoto | H04N 7/17354 |
| 2018/0060641 A1* | 3/2018 | Kim | G06K 9/0004 |
| 2018/0074614 A1* | 3/2018 | Hiraga | G06F 3/0412 |
| 2019/0384428 A1* | 12/2019 | Ahn | G06F 3/0418 |
| 2020/0242324 A1* | 7/2020 | Li | G06K 9/00013 |
| 2020/0350374 A1* | 11/2020 | Yuan | H01L 31/153 |
| 2021/0124441 A1* | 4/2021 | Ding | G06F 3/042 |
| 2021/0134896 A1* | 5/2021 | Guo | H01L 27/3227 |

FOREIGN PATENT DOCUMENTS

| | | | |
|---|---|---|---|
| CN | 107506728 A | * 12/2017 | ......... G02B 6/12004 |
| CN | 109346498 A | 2/2019 | |

\* cited by examiner

ARRAY SUBSTRATE AND DISPLAY PANEL

CROSS-REFERENCE TO RELATED APPLICATION

The application is a US National Stage of International Application No. PCT/CN2019/090928, filed Jun. 12, 2019, which claims priority to Chinese Patent Application No. 201811086394.1, filed with the Chinese Patent Office on Sep. 18, 2018, and entitled "ARRAY SUBSTRATE AND DISPLAY PANEL", the content of which is hereby incorporated by reference in its entirety.

FIELD

The present disclosure relates to the technical field of display, in particular to an array substrate and a display panel.

BACKGROUND

At present, all colors of light in various display panels are mixed by R (red) light, G (green) light and B (blue) light in different proportions. A set of red sub-pixel, green sub-pixel and blue sub-pixel that may emit red light, green light and blue light constitute a minimum display element. Any color on the display panel may be recorded and expressed by a set of RGB values, thus the red light, green light and blue light are also called three primary color lights.

OLED (Organic Electroluminescence Display) has a unique self-illumination characteristic of an area source. Compared with LCD (Liquid Crystal Display) requiring backlight, the OLED has a broader color gamut and a wider viewing angle. Specifically, the wide color gamut of the OLED comes from luminescent characteristics of the material thereof. Organic luminaries of different materials may emit three primary color spectrum of red light, green light and blue light with pure hue; the wide viewing angle of the OLED benefits from the characteristics of the area source composed of light-emitting devices in the sub-pixel and irradiating light around. However, the self-illumination utilization ratio of the OLED is low.

SUMMARY

Embodiments of the present disclosure provide an array substrate and a display panel to convert a light of the second waveband independent of brightness and tone purity in self-illumination of a display panel into electric energy, so as to improve the self-illumination utilization rate and display effect of the OLED. The electric energy obtained from the conversion may be used for self-charging to save energy consumption.

The embodiment of the present disclosure provides an array substrate, including: a base substrate; a plurality of organic electroluminescence components arranged on the base substrate in an array, where a luminescent spectrum of each organic electroluminescence component includes a first waveband and a second waveband, the first waveband is determined by an emission peak of the luminescent spectrum and is used to determine brightness and tone purity of light emitted by the organic electroluminescence component; at least one photoelectric conversion component corresponding to the organic electroluminescence component and at least used to convert the light of the second waveband emitted by the corresponding organic electroluminescence component into electric energy.

In some embodiments, the photoelectric conversion component is located at an edge of an area where the corresponding organic electroluminescence component is located, or located at a gap between two adjacent organic electroluminescence components.

In some embodiments, the photoelectric conversion component is located on a side of the organic electroluminescence component away from the base substrate. The array substrate further includes a thermoelectric/piezoelectric conversion component located between the photoelectric conversion component and the organic electroluminescence component. The thermoelectric/piezoelectric conversion component is used to convert thermal energy emitted by the photoelectric conversion component and pressure of the thermoelectric/piezoelectric conversion component into electric energy. The thermoelectric/piezoelectric conversion component and the organic electroluminescence component are insulated with each other.

In some embodiments, positive projection of the thermoelectric/piezoelectric conversion component on the base substrate coincides with positive projection of the photoelectric conversion component on the base substrate.

In some embodiments, the thermoelectric/piezoelectric conversion component includes a first transparent electrode, a thermoelectric/piezoelectric material layer and a second transparent electrode arranged successively in a stackup manner. The second transparent electrode is located on a side of the thermoelectric/piezoelectric material layer facing toward the photoelectric conversion component.

In some embodiments, the photoelectric conversion component includes a poly-3-hexylthiophene layer, a zinc oxide layer and a third transparent electrode successively located on a side of the second transparent electrode away from the thermoelectric/piezoelectric material layer.

In some embodiments, the photoelectric conversion component is located between the base substrate and a layer where the organic electroluminescence component is located. The photoelectric conversion component is used to convert light of the first waveband and the second waveband emitted by the organic electroluminescence component and irradiating in a direction of the base substrate.

In some embodiments, the array substrate further includes: a pixel defining layer for defining an area where each organic electroluminescence component is located. The pixel defining layer has a groove at a position corresponding to the photoelectric conversion component on a face away from the base substrate, and a side of the groove includes a light guiding layer. The groove is used for guiding the light from the organic electroluminescence component irradiating the light guiding layer and light from outside irradiating the bottom of the groove to the photoelectric conversion component. The photoelectric conversion component is further used to convert the light guided out through the groove and the received light from the outside into electric energy.

In some embodiments, a cross section of the groove perpendicular to a direction of the base substrate is a trapezoid structure with a wide top and a narrow bottom.

In some embodiments, an included angle between a side of the groove and a surface of the pixel defining layer away from the base substrate is 10 to 80 degrees.

In some embodiments, depth of the groove is two-thirds of thickness of the pixel defining layer.

In some embodiments, a material of the light guiding layer is a metal with a reflective property.

In some embodiments, positive projection of the groove on the base substrate coincides with positive projection of the photoelectric conversion component on the base substrate.

In some embodiments, the array substrate further includes a transistor layer located between the base substrate and a layer where the organic electroluminescence component is located. The photoelectric conversion component is located between the base substrate and the transistor layer.

In some embodiments, the photoelectric conversion component is located on a side of the organic electroluminescence component away from the base substrate. The photoelectric conversion component is used to convert the light of the second waveband emitted by the organic electroluminescence component and irradiating a display side into electric energy.

In some embodiments, the photoelectric conversion component includes a fourth transparent electrode, a P-type semiconductor layer, an intrinsic semiconductor layer, an N-type semiconductor layer and a fifth transparent electrode arranged in the stackup manner.

In some embodiments, a material of the intrinsic semiconductor layer corresponding to the organic electroluminescence component emitting red light is amorphous silicon. A material of the intrinsic semiconductor layer corresponding to the organic electroluminescence component emitting green light is amorphous silicon doped with $5*10^{14}$ carbon particles. A material of the intrinsic semiconductor layer corresponding to the organic electroluminescence component emitting blue light is amorphous silicon doped with $9*10^{13}$ carbon particles.

In some embodiments, the array substrate further includes a first insulating layer and wiring located on a side of the fifth transparent electrode away from the N-type semiconductor layer; the first insulating layer covers side surfaces of the fourth transparent electrode, the P-type semiconductor layer, the intrinsic semiconductor layer, the N-type semiconductor layer and the fifth transparent electrode that are respectively perpendicular to the base substrate. The wiring is connected to the fifth transparent electrode through a via hole penetrating through the first insulating layer.

In some embodiments, the array substrate further includes a packaging layer arranged between the organic electroluminescence component and the photoelectric conversion component.

In some embodiments, the array substrate further includes a touch component located at a gap of each organic electroluminescence component.

In some embodiments, the touch component includes a first touch electrode, a second insulating layer and a second touch electrode arranged in the stackup manner.

In some embodiments, the touch component is located on a side of the organic electroluminescence component away from the base substrate. When the photoelectric conversion component is located on the side of the organic electroluminescence component away from the base substrate, the first touch electrode and the fourth transparent electrode are arranged in the same layer, the first insulating layer is reused as the second insulating layer, and the second touch electrode and the wiring are arranged in the same layer.

Based on the same inventive concept, the embodiment of the present disclosure further provides a display panel, including an array substrate and a protection cover plate which are oppositely arranged, where the array substrate is the array substrate of the embodiments of the present disclosure.

The embodiments of the present disclosure include at least the following advantageous effects.

The embodiment of the present disclosure provides an array substrate and a display panel. The array substrate includes: a base substrate, organic electroluminescence components arranged in an array on the base substrate, and at least one photoelectric conversion component corresponding to each of the organic electroluminescence components, where a luminescent spectrum of the organic electroluminescence component includes a first waveband and a second waveband; the first waveband is determined by an emission peak of the luminescent spectrum and is used to determine brightness and tone purity of light emitted by the organic electroluminescence component; and the photoelectric conversion component is at least used to convert light of the second waveband emitted by the corresponding organic electroluminescence component into electric energy.

Since the present disclosure additionally arranges the photoelectric conversion component corresponding to the organic electroluminescence component on the array substrate, the light of the second waveband emitted by the organic electroluminescent component and independent of the brightness and tone purity may be converted into electric energy through the corresponding photoelectric conversion component, and the electric energy may be used for self-charging. Therefore, the self-illumination utilization ratio of the display panel is improved.

Furthermore, a display effect of the display panel can be improved. Meanwhile, energy consumption is saved.

DETAILED DESCRIPTION OF THE EMBODIMENTS

The embodiments of the array substrate and the display panel provided in the present disclosure will be described in detail in combination with the attached drawings. It shall be noted that the embodiments described herein are only part of the embodiments of the present disclosure, rather than all of them. In the case of no conflict, the embodiments in the application and the features in the embodiments can be combined with each other. In addition, based on the embodiments in the present disclosure, all other embodiments obtained by those skilled in the art without creative work belong to the protection scope of the present disclosure.

Figure 1:
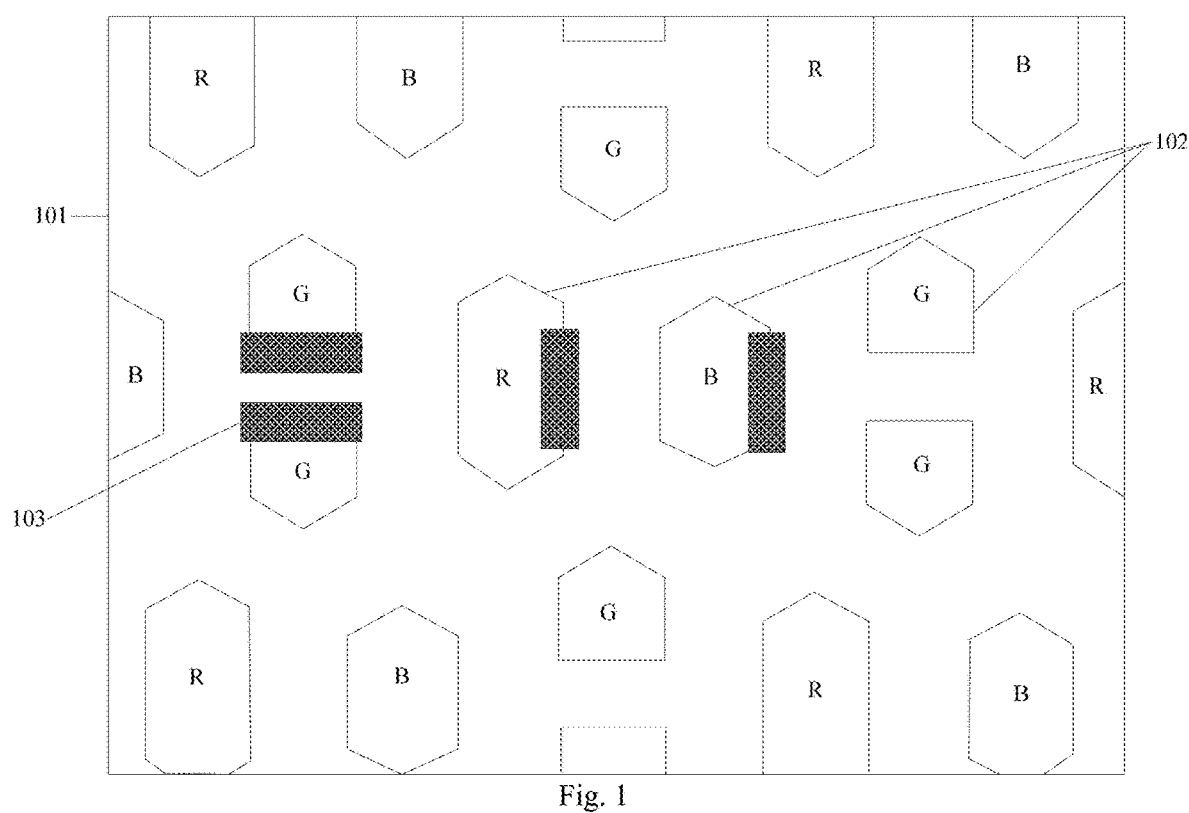
FIG. 1 is a structural diagram showing an array substrate according to embodiments of the present disclosure.

As shown in FIG. 1, the embodiment of the present disclosure provides an array substrate. The array substrate includes a base substrate 101, a plurality of organic electroluminescence components 102, and at least one photoelectric conversion component 103.

The plurality of organic electroluminescence components 102 are arranged in an array on the base substrate 101.

The at least one photoelectric conversion component 103 corresponds to the organic electroluminescence components 102 and at least used to convert light of the second waveband emitted by the corresponding organic electroluminescence component 102 into electric energy.

In some embodiments, each organic electroluminescence component 102 may correspond to at least one photoelectric conversion component 103. A luminescent spectrum of the organic electroluminescence component 102 includes a first waveband and a second waveband. The first waveband is determined by an emission peak of the luminescent spectrum and is used to determine brightness and tone purity of the light emitted by the organic electromechanical component.

In some embodiments, as shown in FIG. 1, the organic electroluminescence component 102 may be a red light emitting component R, a green light emitting component G or a blue light emitting component B. Of course, in specific embodiment, the organic electroluminescence component 102 may also be a yellow light emitting component, which is not limited here.

Figure 2:
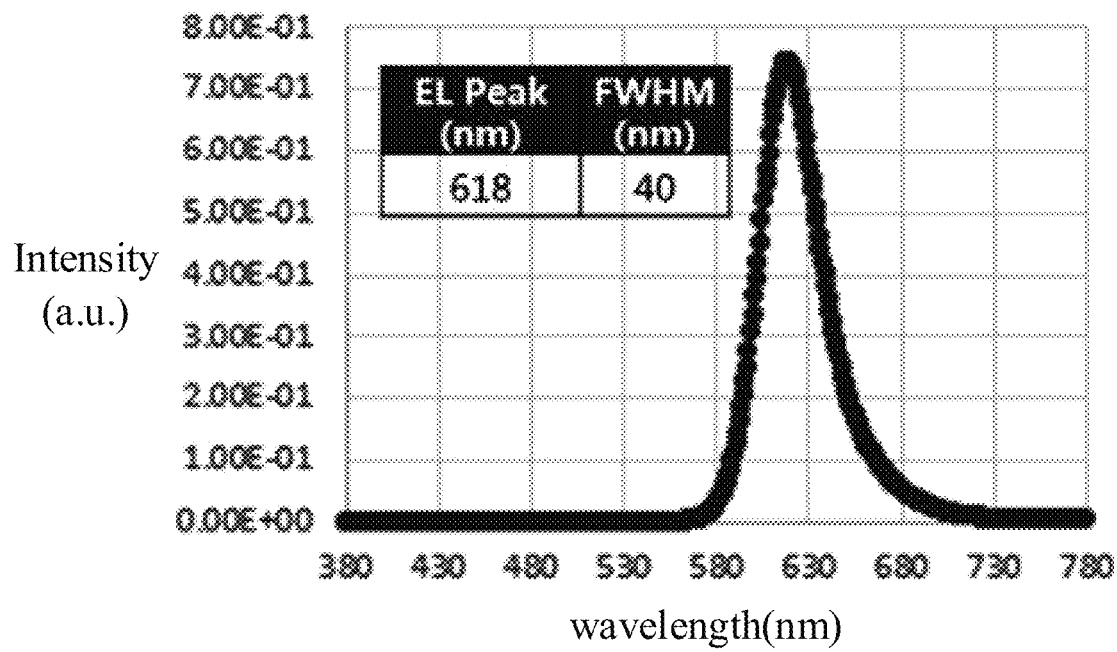
FIG. 2 is a diagram showing a luminescent spectrum of a red light emitting component.

Moreover, when the organic electroluminescence component 102 is a red light emitting component R, the corresponding luminescent spectrum is shown in FIG. 2. It can be seen from FIG. 2 that an emission peak EL peak of the red light emitting component R is 618 nm, and a half peak width FWHM is 40 nm.

It is well known that the emission peak EL peak of the luminescent spectrum determines luminescent brightness and tone purity of the organic electroluminescence component 102. In the present disclosure, the first waveband of the red light emitting component R may be a waveband near the emission peak EL peak, for example, 580 nm-638 nm, and the corresponding second waveband may be 639 nm-730 nm. The photoelectric conversion component 103 corresponding to the red light emitting component R converts light of the second waveband ranging in 639 nm-730 nm into electric energy.

In this way, the self-illumination utilization ratio of the red light emitting component R is improved, the self-illumination brightness and tone purity of the red light emitting component R are further ensured simultaneously, and a display effect can be improved. Moreover, the electric energy obtained from the conversion can also be used for self-charging, such that energy consumption is saved.

Figure 3:
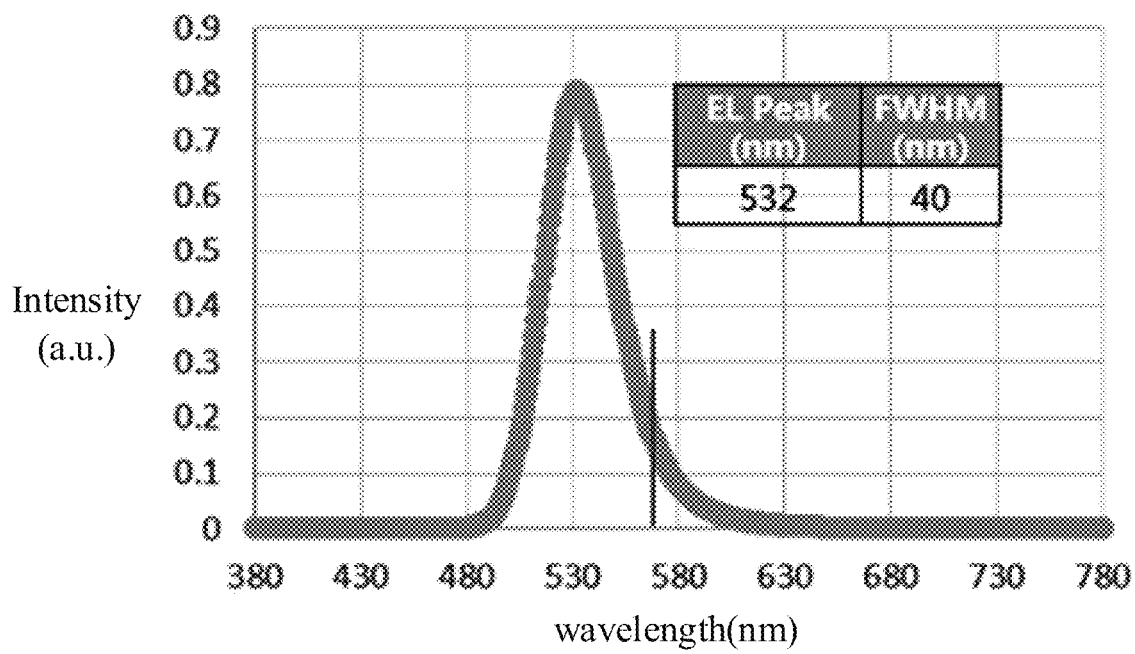
FIG. 3 is a diagram showing a luminescent spectrum of a green light emitting component.

When the organic electroluminescence component 102 is a green light emitting component G, the corresponding luminescent spectrum is shown in FIG. 3. It can be seen from FIG. 3 that an emission peak EL peak of the green light emitting component G is 532 nm, and a half peak width FWHM is 40 nm. Based on the similar principle with the red light emitting component R, the first waveband of the green light emitting component G may be a waveband near the emission peak EL peak, for example, 480 nm-552 nm, and the corresponding second waveband may be 553 nm-630 nm. The photoelectric conversion component 103 corresponding to the green light emitting component G converts light of the second waveband light ranging within 553 nm-630 nm into electric energy.

In this way, the self-illumination utilization ratio of the green light emitting component G is improved, the self-illumination brightness and tone purity of the green light emitting component G are further ensured simultaneously, and a display effect is improved. Moreover, the electric energy obtained from the conversion can also be used for self-charging, such that energy consumption is saved.

Figure 4:
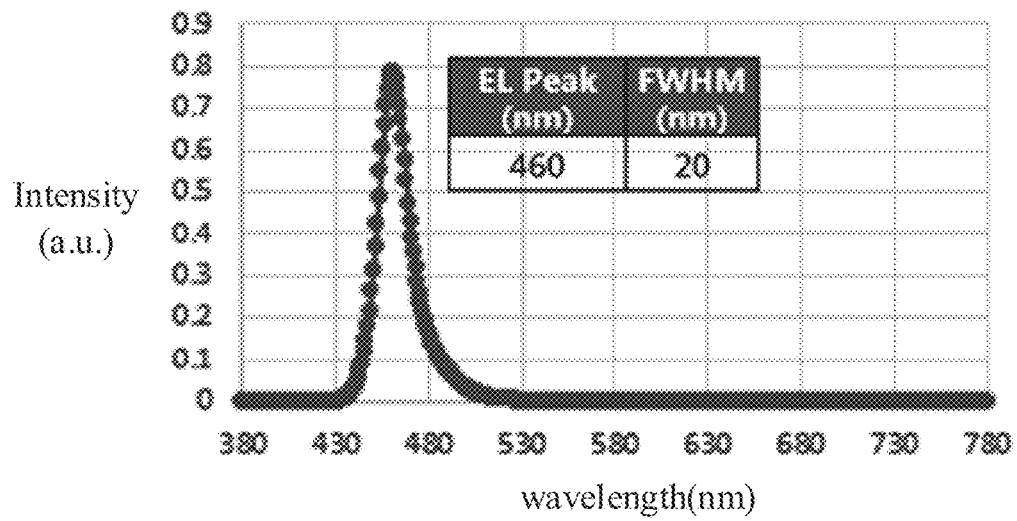
FIG. 4 is a diagram showing a luminescent spectrum of a blue light emitting component.

When the organic electroluminescence component 102 is a blue light emitting component B, the corresponding luminescent spectrum is shown in FIG. 4. It can be seen form FIG. 4 that an emission peak EL peak of the blue light emitting component B is 460 nm, and a half peak width FWHM is 20 nm. Based on the similar principle with the red light emitting component R, the first waveband of the blue light emitting component B may be a waveband near the emission peak EL peak, for example, 430 nm-470 nm, and the corresponding second waveband may be 471 nm-530 nm. The photoelectric conversion component 103 corresponding to the blue light emitting component B converts light of the second waveband ranging within 471 nm-530 nm into electric energy.

In this way, the self-illumination utilization ratio of the blue light emitting component B is improved, and the self-illumination brightness and tone purity of the blue light emitting component B are further ensured simultaneously, and a display effect is improved. Moreover, the electric energy obtained from the conversion can also be used for self-charging, such that energy consumption is saved.

It shall be noted that in a practical application, ranges of the first waveband and the second waveband of the red light emitting component R, the green light emitting component G and the blue light emitting component B may be flexibly set as required, which are not limited to the above exemplary ranges.

The above are some implementations to illustrate that the photoelectric conversion component 103 converts the light of the second waveband in light emitted from the corresponding organic electroluminescence component 102 to a display side into electric energy.

Figure 5:
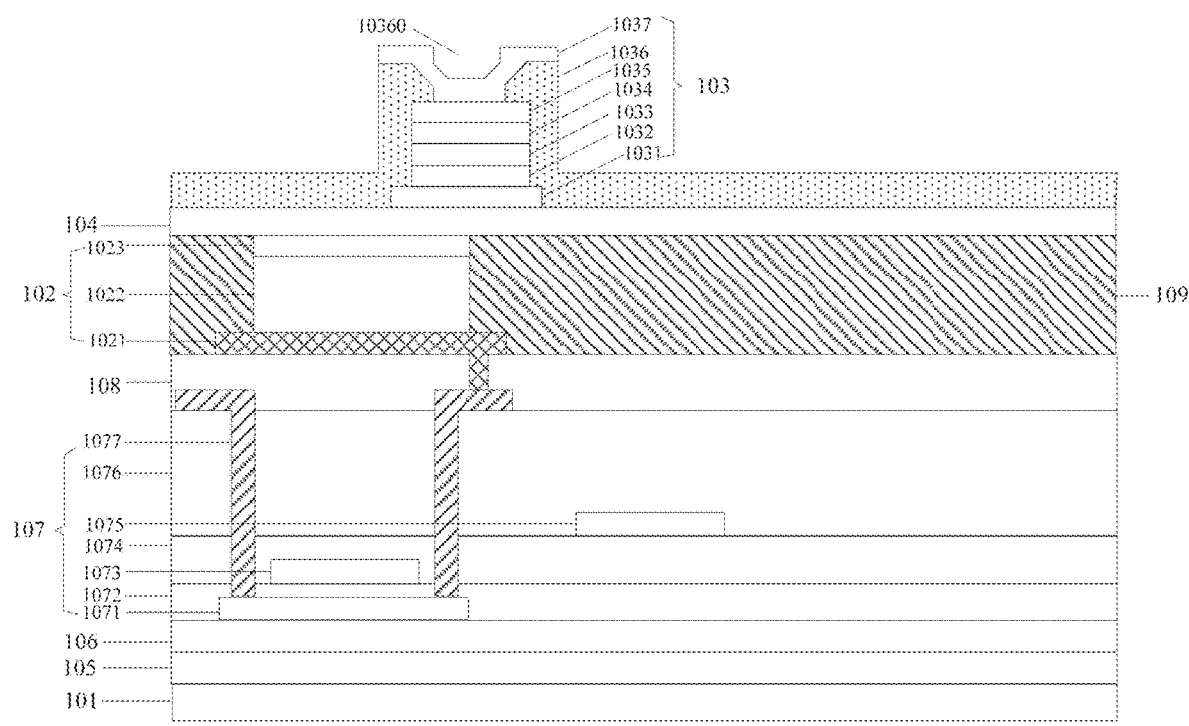
FIG. 5 is a structural diagram showing an array substrate according to a first embodiment of the present disclosure.

As shown in FIG. 5, the organic electroluminescence component 102 includes an anode 1021, a light-emitting layer 1022 and a cathode 1023. The light-emitting layer 1022 includes a hole injection layer, a hole transport layer, a luminescent material layer, an electron transport layer and an electron injection layer.

Specifically, the organic electroluminescence component 102 may be a top-emitting-structured organic electroluminescence component 102 or a bottom-emitting-structured organic electroluminescence component 102. In addition, in order to ensure an opening ratio, in the embodiments according to the present disclosure, the top-emitting-structured organic electroluminescence component 102 is adopted, in which the anode 1021 is an opaque total reflection electrode and the cathode 1023 located above the anode 1021 is a transparent or semi-transparent electrode.

When applying voltage to the top-emitting-structured organic electroluminescence component 102, light is emitted from a top transparent or semitransparent electrode (i.e. the cathode 1023). However, due to limited light transmittance of the cathode 1023, a part of the light will be reflected to the base substrate 101 by the cathode 1023, resulting in light leakage at the bottom. Furthermore, a part of the light emitted by the organic electroluminescence component 102 further irradiates a pixel defining layer for defining an area where the organic electroluminescence component 102 is located, resulting in light leakage on a side of the display panel. Therefore, the part of the light may further be guided to a direction of the base substrate 101.

Therefore, in a specific application, the photoelectric conversion component 103 may further be provided on the base substrate 101, and the photoelectric conversion component 103 may be used to convert the light emitted by the organic electroluminescence component 102 and reflected by the cathode 1023 and the light irradiating the pixel defining layer and guided to the base substrate 101 (i.e. including light of the first waveband light and the second waveband) into electric energy, thus improving the self-illumination utilization ratio of the organic electroluminescence component 102 while avoiding light leakage at the bottom and the side, and enhancing stability of the display panel without affecting the display performance.

It can be known from the above description that in the array substrate according to the embodiments of the present disclosure, by additionally arranging the photoelectric conversion component 103 corresponding to the organic electroluminescence component 102 in the array substrate, the light of the second waveband emitted by the organic electroluminescence component 102 and independent of the brightness and tone purity may be converted into electric energy through the corresponding photoelectric conversion component 103. Therefore, the self-illumination utilization ratio of the display panel is improved without affecting its display performance. Moreover, the electric energy obtained from the conversion by the photoelectric conversion component 103 can charge a battery at any time, such that energy consumption can be saved.

In order to better understand the technical solutions of the present disclosure, five embodiments are described below for description.

In a specific embodiment.

The embodiment of the present disclosure provides an array substrate, as shown in FIG. 5, including a base substrate 101, organic electroluminescence components 102 located on the base substrate 101, and at least one photoelectric conversion component 103 corresponding to each of the organic electroluminescence components 102. A luminescent spectrum of the organic electroluminescence component 102 includes a first waveband and a second waveband. The first waveband is determined by an emission peak of the luminescent spectrum and is used to determine brightness and tone purity of light emitted by the organic electroluminescence component.

The photoelectric conversion component 103 is used to convert the light of the second waveband emitted by the corresponding organic electroluminescence component 102 and irradiating a display side (that is, one side of the organic electroluminescence component 102 away from the base substrate 101) into electric energy.

It can be seen from the above analysis that when the photoelectric conversion component 103 converts the light of the second waveband emitted by the corresponding organic electroluminescence component 102 and irradiating the display side into electric energy, not only can the self-illumination utilization ratio of the display panel be improved, and energy consumption can be saved, but also luminescent brightness and tone purity can be improved, to thereby improve the display effect.

In a specific implementation, in the array substrate provided by the embodiment of the present disclosure, in order to ensure the opening ratio, the photoelectric conversion component 103 is located at an edge of an area where the corresponding organic electroluminescence component 102 (as shown in FIG. 1) is located, or located at a gap between adjacent two organic electroluminescence components 102.

Further, the array substrate provided by the embodiment of the present disclosure, as shown in FIG. 5, further includes a packaging layer 104 located on one side of the organic electroluminescence component 102 away from the base substrate 101. The photoelectric conversion component 103 is located on one side of the packaging layer 104 away from the organic electroluminescence component 102, that is, on an upper surface of the packaging layer 104 in FIG. 2.

In this way, by additionally arranging a photoelectric conversion component 103 above an existing array substrate, on the one hand, it can ensure that the photoelectric conversion component 103 converts the light of the second waveband emitted upward by the corresponding organic electroluminescence component 102 and irradiating the photoelectric conversion component 103 into electric energy; on the other hand, it can maintain a preparation process of the existing array substrate, thereby increasing the preparation process of the photoelectric conversion component 103. Therefore, the preparation method is relatively simple.

It can be understood that the array substrate provided by the embodiment of the present disclosure, as shown in FIG. 5, further includes a polyimide layer 105, a first buffer layer 106, a transistor layer 107 and a first flat layer 108, and a pixel defining layer 109 for defining an area where the organic electroluminescence component 103 is located. Further, the transistor layer 107 includes an active layer 1071, a first gate insulating layer 1072, a first gate 1073, a second gate insulating layer 1074, a second gate 1075, an interlayer dielectric layer 1076, and a source drain electrode 1077.

In addition, in the array substrate provided by the embodiment of the present disclosure, as shown in FIG. 5, the photoelectric conversion component 103 includes a fourth transparent electrode 1031, a P-type semiconductor layer 1032, an intrinsic semiconductor layer 1033, an N-type semiconductor layer 1034, and a fifth transparent electrode 1035 arranged in the stackup manner.

The array substrate may be further provided with a first insulating layer 1036 and a wiring 1037 on one side of the fifth transparent electrode 1035 away from the N-type semiconductor layer 1034, and the wiring 1037 is connected to the fifth transparent electrode 1035 through a via hole penetrating through the first insulating layer 1036.

Moreover, the first insulating layer 1036 covers side surfaces of the fourth transparent electrode 1031, the P-type semiconductor layer 1032, the intrinsic semiconductor layer 1033, the N-type semiconductor layer 1034, and the fifth transparent electrode 1035, that are respectively perpendicular to the base substrate 101, and a side surface of the packaging layer 104 away from the organic electroluminescence component 102.

In a practical application, the P-type semiconductor layer 1032, the intrinsic semiconductor layer 1033 and the N-type semiconductor layer 1034 may be semiconductor layers based on materials such as gallium nitride, copper indium gallium selenium or silicon-based materials, which are not specifically defined herein.

Furthermore, materials of the fourth transparent electrode 1031, the fifth transparent electrode 1036 and the wiring 1037 may be ITO, IZO, etc.

Further, in the array substrate provided by the embodiment of the present disclosure, since the absorption rate of red light by the intrinsic semiconductor layer 1033, such as the silicon-based amorphous silicon (α-Si) semiconductor layer itself is low (less than 5%), thus when the organic electroluminescence component 102 is a red light emitting component R, it is unnecessary to dope the intrinsic semiconductor layer 1033. When the organic electroluminescence component 102 is a green light emitting component G or a blue light emitting component B, in order to enable the corresponding photoelectric conversion component 103 to absorb the light of the second waveband, a preset number of carbon particles need to be doped into the intrinsic semiconductor layer 1033.

Taking the intrinsic semiconductor layer 1033 being an α-Si semiconductor layer as the example, when the organic electroluminescence component 102 is a green light emitting component G, $5*10^{14}$ carbon particles may be doped into the α-Si semiconductor layer to increase band gap of α-Si and realize absorption and conversion of the light of the second waveband by the blue light emitting component B. When the organic electroluminescence component 102 is a blue light emitting component B, $9*10^{13}$ carbon particles may be doped into the α-Si semiconductor layer to increase the band gap of α-Si and realize the absorption and conversion of the light of the second waveband light by the blue light emitting component B.

Figure 6:
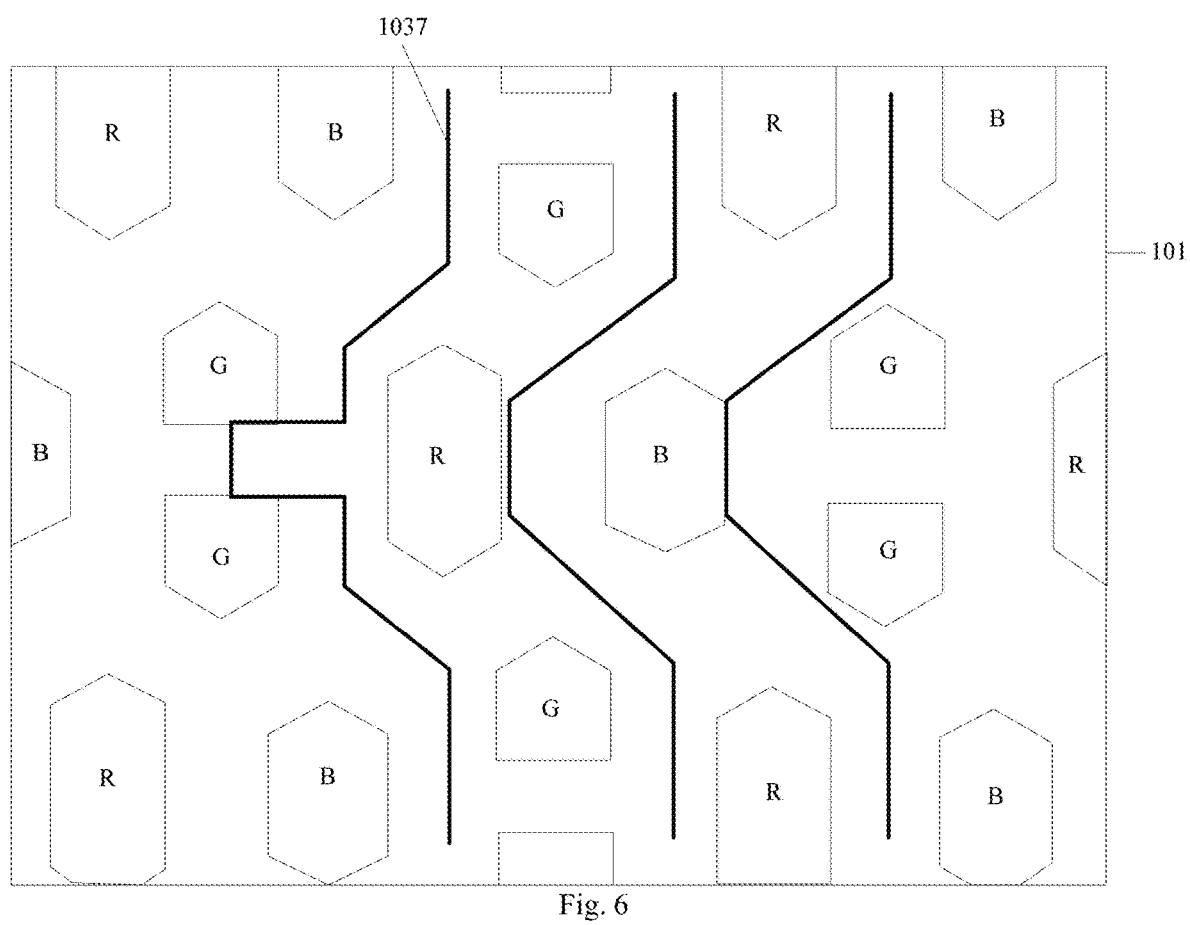
FIG. 6 is a structural diagram showing an array substrate according to a second embodiment of the present disclosure.
Figure 7:
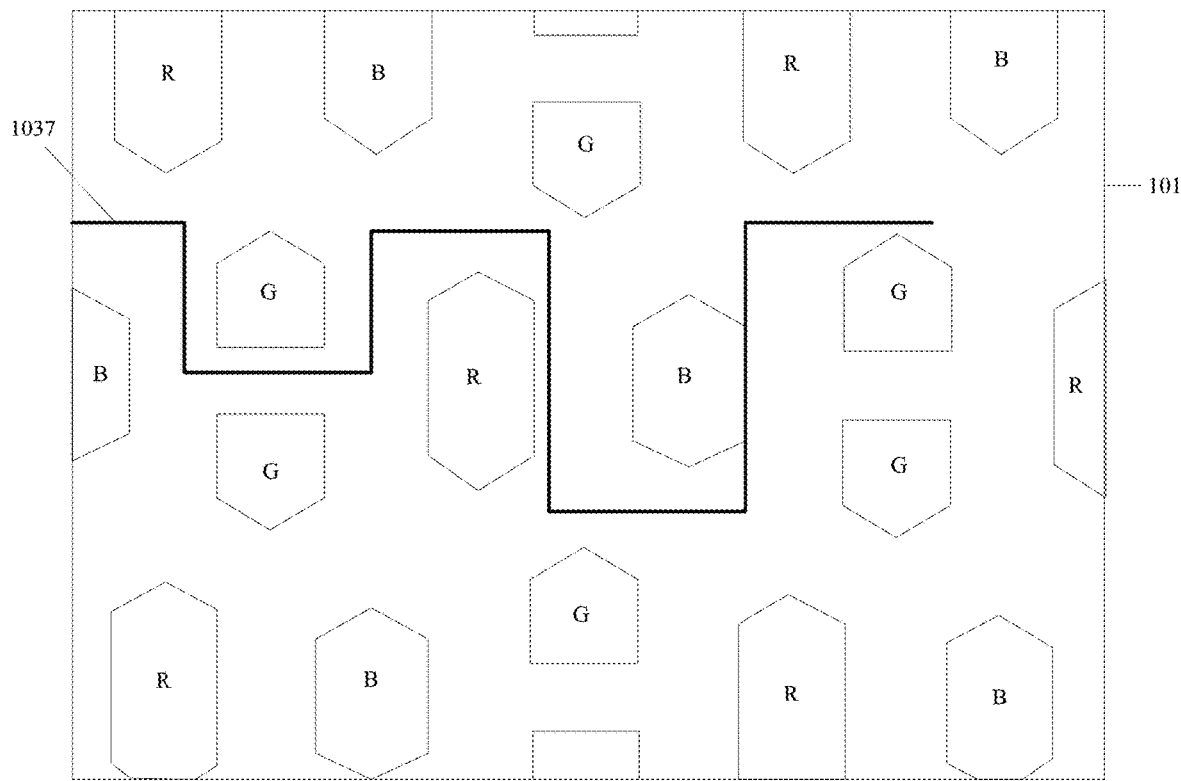
FIG. 7 is a wiring diagram showing wiring according to the second embodiment of the present disclosure.

In addition, in the array substrate provided by the embodiment of the present disclosure, in order to make use of the electric energy converted by each photoelectric conversion component 103, the fifth transparent electrode 1031 of each photoelectric conversion component 103 may be connected with each other, and the wiring 1037 of each photoelectric conversion component 103 may be connected with each other. Specifically, the wiring 1037 of each photoelectric conversion component 103 may be interconnected in a manner as shown in FIG. 6 and FIG. 7.

In a specific embodiment.

Figure 8:
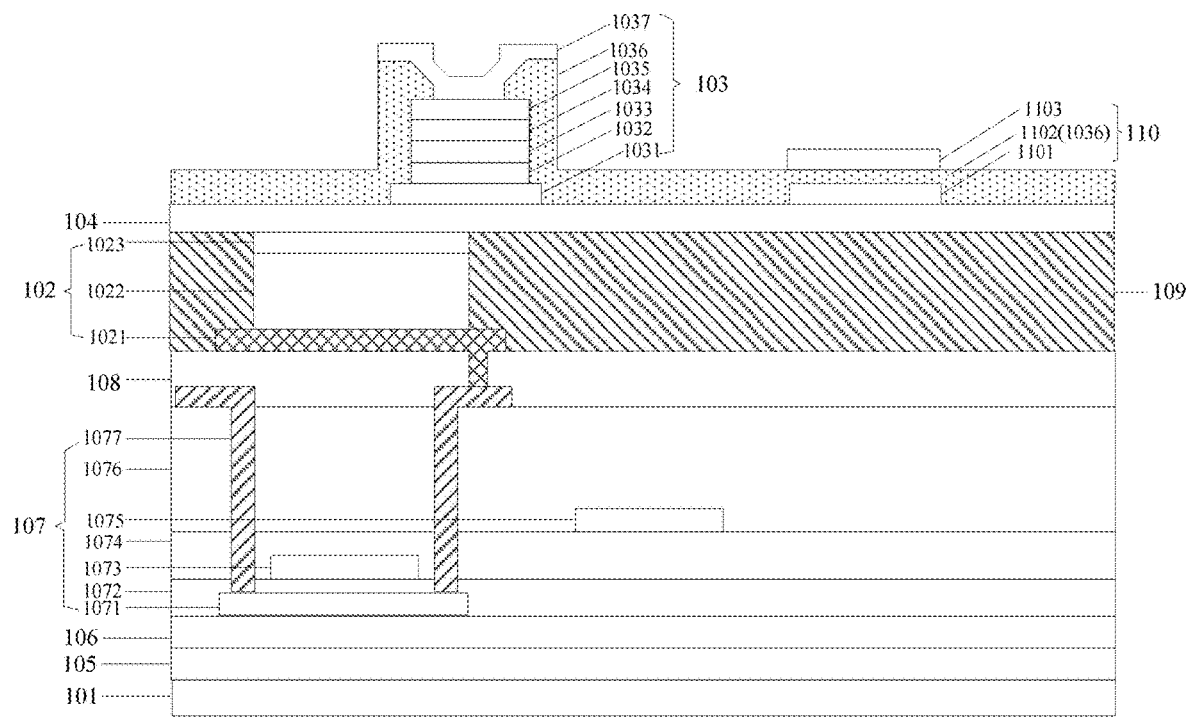
FIG. 8 is another wiring diagram showing wiring according to the second embodiment of the present disclosure.

The embodiment of the present disclosure provides an array substrate, as shown in FIG. 8. Since the array substrate provided by the embodiment of the present disclosure is only integrated with a touch function in the array substrate provided by the embodiment of the present disclosure as compared with an array substrate provided by the corresponding embodiment of FIG. 5. Therefore, the content of the array substrate realizing the touch function provided by the embodiment of the present disclosure will be introduced, and the repetition of the embodiment corresponding to FIG. 5 will be omitted herein.

Specifically, the array substrate provided by the embodiment of the present disclosure, as shown in FIG. 8, further includes: a touch component 110 located at a gap of each organic electroluminescence component 102.

The touch component 110 includes a first touch electrode 1101, a second insulating layer 1102 and a second touch electrode 1103 successively located on one side of the packaging layer 104 away from the organic electroluminescence component 102.

In order to simplify the manufacturing process and save the manufacturing cost, the first touch electrode 1101 may be provided in the same layer with the fourth transparent electrode 1031 in the photoelectric conversion component 103, the second insulating layer 1102 may be multiplexed with the first insulating layer 1036 in the photoelectric conversion component 103, and the second touch electrode 1103 may be provided in the same layer with the wiring 1037.

In a specific embodiment.

Figure 9:
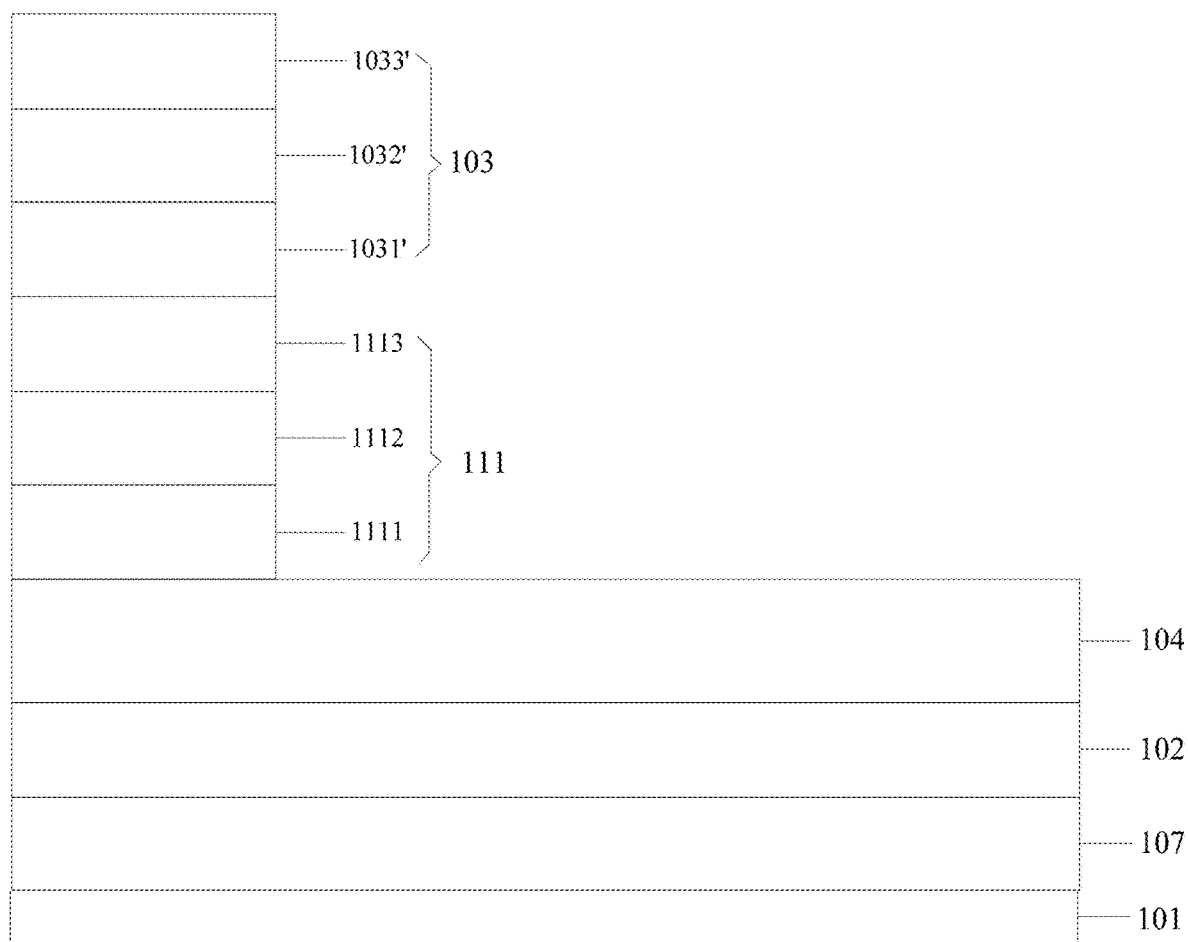
FIG. 9 is a structural diagram showing an array substrate according to a third embodiment of the present disclosure.

The embodiment of the present disclosure provides an array substrate as shown in FIG. 9. Compared with the array substrate provided by the corresponding embodiment of FIG. 5, the difference thereof lies in that the structures of the photoelectric conversion component 103 in the two array substrates are different, and the function of thermoelectric and piezoelectric conversion may be realized by the array substrate provided by the embodiment of the present disclosure. Therefore, only the differences between the embodiments of the present disclosure and the corresponding embodiment of FIG. 5 will be described below, and the repetition will be omitted herein.

Specifically, the array substrate provided by the embodiment of the present disclosure, as shown in FIG. 9, further includes a thermoelectric/piezoelectric conversion component 111 located between the packaging layer 104 and the photoelectric conversion component 103. The thermoelectric/piezoelectric conversion component 111 is used to convert thermal energy emitted by the photoelectric conversion component 103 and pressure of the thermoelectric/piezoelectric conversion component 111 into electric energy.

Further, positive projection of the thermoelectric/piezoelectric conversion component 111 on the base substrate 101 coincides with positive projection of the photoelectric conversion component 103 on the base substrate 101.

Further, in the array substrate provided by the embodiment of the present disclosure, as shown in FIG. 9, the thermoelectric/piezoelectric conversion component 111 includes a first transparent electrode 1111, a thermoelectric/piezoelectric material layer 1112 and a second transparent electrode 1113 successively located on one side of the packaging layer 104 facing toward the photoelectric conversion component 103. In a practical application, the material of the thermoelectric/piezoelectric material layer 1112 may be materials with thermoelectric and piezoelectric properties, such as PZT, PVDF or ZnO.

In a specific implementation, in the array substrate provided by the embodiment of the present disclosure, the photoelectric conversion component 103 includes a poly-3-hexylthiophene layer 1031', a zinc oxide layer 1032' and a third transparent electrode 1033' successively located on one side of the second transparent electrode 1113 away from the thermoelectric/piezoelectric material layer 1112.

In the array substrate provided by the embodiment of the present disclosure, the display panel may be powered at any time and place by integrating the thermoelectric/piezoelectric function and the photoelectric conversion function. Moreover, the thermoelectric/piezoelectric conversion component 111 is made of the same material. The component 111 has the advantages of low manufacturing cost and small overall size.

In a specific embodiment.

Figure 10:
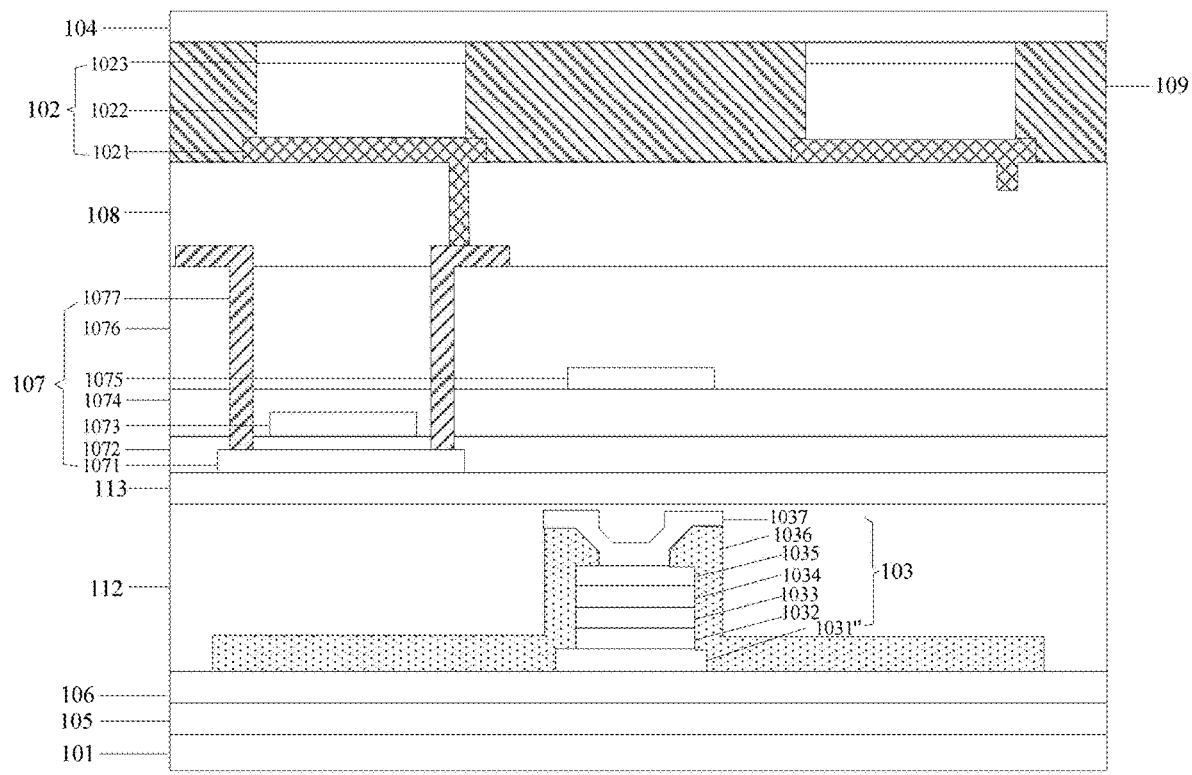
FIG. 10 is a structural diagram showing an array substrate according to a fourth embodiment of the present disclosure.

The embodiment of the present disclosure provides an array substrate shown in FIG. 10. Compared with the array substrate provided by the embodiment corresponding to FIG. 5 of the present disclosure, the difference thereof mainly lies in a specific setting position and different functions of the photoelectric conversion component 103. Therefore, the differences between the embodiment of the present disclosure and the corresponding embodiment of FIG. 5 will be described below, and the repetition will be omitted herein.

Specifically, in the array substrate provided by the embodiment of the present disclosure, the photoelectric conversion component 103 is arranged between the base substrate 101 and a layer where the organic electroluminescence component 102 is located. The photoelectric conversion component 103 is used to convert light of the first and second waveband emitted by the organic electroluminescence component 102, reflected by the cathode 1023 of the top-emitting-structured organic electroluminescence component 102 and irradiating in a direction of the base substrate 101 into electric energy, so as to increase the self-illumination utilization ratio of the display panel, save energy consumption, avoid light leakage at the bottom, and improve the stability of the display panel.

Specifically, in order to better receive the light reflected by the cathode 1023 and irradiating the base substrate 101, the photoelectric conversion components 103 may be evenly distributed on the base substrate 101.

Specifically, the array substrate provided by the embodiment of the present disclosure, as shown in FIG. 10, may further include a transistor layer 107 located between the base substrate 101 and a layer where the organic electroluminescence component 102 is located. In order to maintain the manufacturing process of the existing array substrate, the photoelectric conversion component 103 may be arranged between the base substrate 101 and the transistor layer 107. In this way, after the photoelectric conversion component 103 is manufactured on the base substrate 101, other film layers in the array substrate are formed by the existing manufacturing process, resulting in less change on the process and reduction of the production cost as much as possible.

Specifically, as shown in FIG. 10, the photoelectric conversion component 103 includes a fourth metal electrode 1031", a P-type semiconductor layer 1032, an intrinsic semiconductor layer 1033, an N-type semiconductor layer 1034, a fifth transparent electrode 1035, a first insulating layer 1036, and a wiring 1037 that are arranged in the stackup manner. The wiring 1037 is connected to the fifth transparent electrode 1035 through a via hole penetrating through the first insulating layer 1036. The fourth metal electrode 1031" is in contact with the base substrate 101. The first insulating layer 1036 also covers surfaces of the fourth metal electrode 1031", the P-type semiconductor layer 1032, the intrinsic semiconductor layer 1033, the N-type semiconductor layer 1034, and the fifth transparent electrode 1035, that are respectively perpendicular to the base substrate 101, and a surface of the base substrate 101 facing toward one side of the organic electroluminescence component 102.

It can be understood that when the polyimide layer 105 and the first buffer layer 106 are further successively arranged on the base substrate 101, the fourth metal electrode 1031" is in contact with the first buffer layer 106, and the first insulating layer 1036 covers surface of the first buffer layer 106 facing toward one side of the organic electroluminescence component 102.

In a specific implementation, in order to ensure the flatness of a bearing surface required for manufacturing a subsequent transistor layer 107, the array substrate provided in the embodiment of the present disclosure, as shown in FIG. 10, may further include a flat layer 112 and a buffer layer 113 successively arranged on one side of a layer where the wiring 1037 is located and faces toward the transistor layer 107.

In a specific embodiment.

Figure 11:
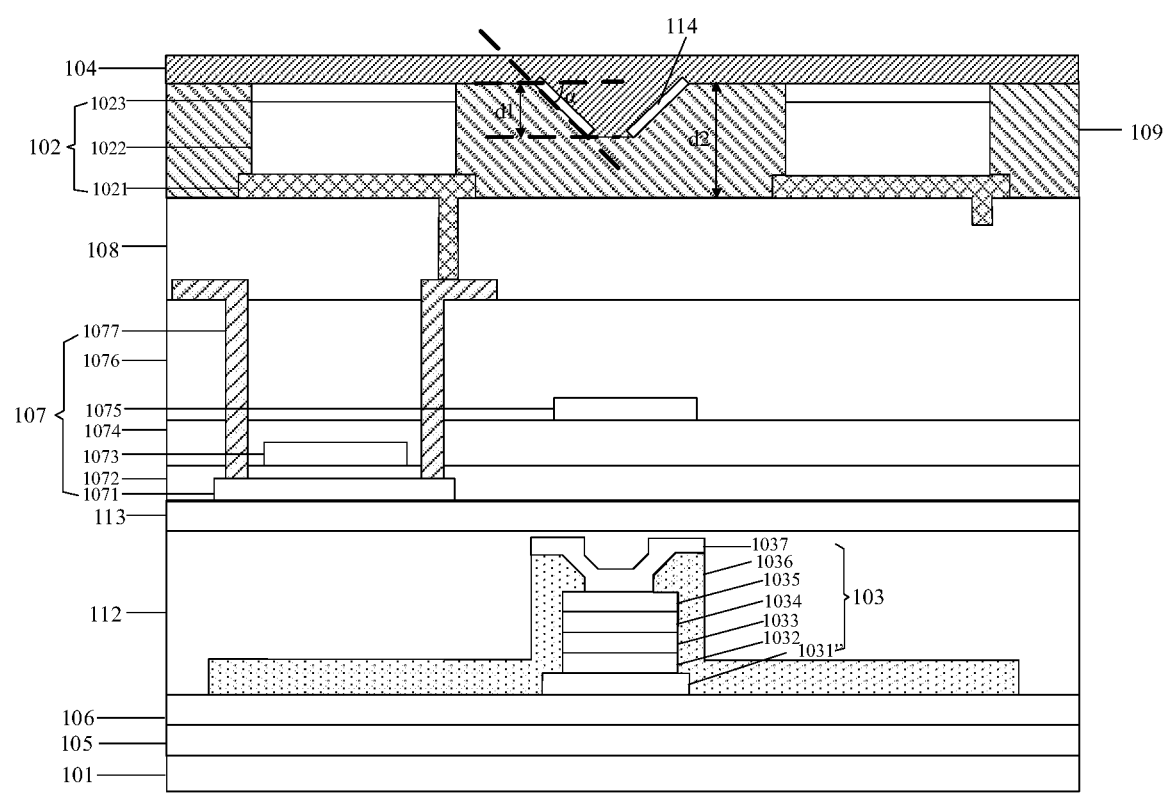
FIG. 11 is a structural diagram showing an array substrate according to a fifth embodiment of the present disclosure.

The embodiment of the present disclosure provides an array substrate shown in FIG. 11. Compared with the array substrate provided by the embodiment corresponding to FIG. 10 of the present disclosure, in order to convert more invalid light (in particular, the light emitted by the organic electroluminescence component 102 and irradiating the pixel defining layer 109, and the light incident from the outside to the interior of the display panel) into electric energy and further save energy consumption, as shown in FIG. 11, embodiment 5 of the present disclosure is provided with a groove at a position corresponding to the photoelectric conversion component 103 on one face of the pixel defining layer 109 away from the base substrate 101 (i.e. an upper surface of the pixel defining layer 109 in FIG. 11), and a side of the groove is provided with a light guiding layer 114.

The groove is used to guide light from the organic electroluminescence component 102 irradiating the light guiding layer 114 and light from the outside irradiating the bottom of the groove to the photoelectric conversion component 103.

The photoelectric conversion component 103 is not only used to convert the light of the first waveband and the second waveband emitted by the organic electroluminescence component 102, reflected by the cathode 1023, guided by the light guiding layer 114 and irradiating the base substrate 101 into electric energy, but also used to convert the light guided out through the groove and the received light from the outside into electric energy.

In the array substrate provided by the embodiment of the present disclosure, in order to better guide the light from the organic electroluminescence component 102 irradiating the light guiding layer 114 in the pixel defining layer 109 to the photoelectric conversion component 103, as shown in FIG. 11, the cross section of the groove perpendicular to the direction of the base substrate 101 may be a trapezoid structure with a wide top and a narrow bottom.

The cross section of the groove perpendicular to the direction of the base substrate 101 may further be other structures as long as the light from the organic electroluminescence component 102 irradiating the light guiding layer 114 in the pixel defining layer 109 may be guided to the photoelectric conversion component 103, which is not specifically limited here.

In the array substrate provided by the embodiment of the present disclosure, in order to achieve better reflection, the included angle $\alpha$ between the side of the groove and the surface of the pixel defining layer 109 away from the base substrate 101 is 10 to 80 degrees.

The depth d1 of the groove is two-thirds of the thickness d2 of the pixel defining layer 109.

The material of the light guiding layer 114 may be a metal with a reflective property.

In order to make the light reflected by the light guiding layer 114 incident on the photoelectric conversion component 103 to a large extent, as shown in FIG. 11, the positive projection of the groove on the base substrate 101 coincides with the positive projection of the photoelectric conversion component 103 on the base substrate 101.

It shall be noted that the above description only introduces the difference between the array substrate provided by the embodiment of the present disclosure and the array substrate provided by the embodiment 4 of the present disclosure. For the repetition, please refer to the above description of the embodiment 4, as no more statement is made herein.

It can be understood that the touch component 110 in the array substrate provided by the embodiment corresponding to FIG. 8 of the present disclosure may also be applied to the array substrate provided by the embodiments corresponding to FIG. 9, FIG. 10 and FIG. 11 of the present disclosure.

Moreover, according to the specific structure of the array substrate provided by the embodiments corresponding to FIG. 9, FIG. 10 and FIG. 11 of the present disclosure, it can be known that when the touch component 110 is applied to the array substrate provided by the embodiments corresponding to FIG. 9, FIG. 10 and FIG. 11 of the present disclosure, the touch component 110 is specifically located at a gap of each organic electroluminescence component 102, including a first touch electrode 1101, a second insulating layer 1102 and a second touch electrode 1103 successively located on one side of the packaging layer 104 away from the organic electroluminescence component 102. Furthermore, each film layer of the touch component 110 does not relate to the problem of multiplexing the film layer or on the same layer of the photoelectric conversion component 103.

In a specific embodiment.

Based on the same inventive concept, the embodiment of the present disclosure further provides a display panel, including an array substrate and a protection cover plate which are oppositely arranged. The array substrate is the array substrate provided by the embodiments of the present disclosure.

The display panel may be a mobile phone, a tablet computer, a TV, a display, a laptop, a digital camera, a navigator, a smart watch, a fitness wrist strap, a personal digital assistant, a self-service deposit/withdrawal machine and any other product or part with a display function.

Other essential components of the display panel that should be listed here as understood by those skilled in the art, for example, a circular polarizer arranged between the array substrate and the protection cover plate, will neither be described here, nor be regarded as a limitation to the present disclosure.

For an implementation of the display panel, please refer to the embodiment of the array substrate above, as the repetition will be omitted.

It shall be noted that in this description, relational terms such as first and second are only used to distinguish one entity or operation from another, but not necessarily to require or imply any such actual relationship or order between these entities or operations.

Obviously, those skilled in the art can make various changes and modifications to the present disclosure without departing from the spirit and scope of the present disclosure. In this way, if these changes and modifications of the present disclosure belong to the scope of the claims of the present disclosure and its equivalent technology, the present disclosure also intends to include these changes and modifications.

The invention claimed is:

1. An array substrate, comprising:
   a base substrate;
   a plurality of organic electroluminescence components, arranged on the base substrate in an array, wherein a luminescent spectrum of each organic electroluminescence component comprises a first waveband and a second waveband, the first waveband is determined by an emission peak of the luminescent spectrum, and is configured to determine brightness and tone purity of light emitted by the organic electroluminescence component; and
   at least one photoelectric conversion component, corresponding to the organic electroluminescence component, and at least configured to convert light of the second waveband emitted by the corresponding organic electroluminescence component into electric energy;
   wherein the photoelectric conversion component comprises a fourth transparent electrode, a P-type semiconductor layer, an intrinsic semiconductor layer, an N-type semiconductor layer and a fifth transparent electrode arranged in a stackup manner;
   wherein a material of the intrinsic semiconductor layer corresponding to the organic electroluminescence component emitting red light is amorphous silicon; a material of the intrinsic semiconductor layer corresponding to the organic electroluminescence component emitting green light is amorphous silicon doped with $5*10^{14}$ carbon particles; and a material of the intrinsic semiconductor layer corresponding to the organic electroluminescence component emitting blue light is amorphous silicon doped with $9*10^{13}$ carbon particles.

2. The array substrate according to claim 1, wherein the photoelectric conversion component is located at an edge of an area where the corresponding organic electroluminescence component is located, or located at a gap between two adjacent organic electroluminescence components.

3. The array substrate according to claim 2, wherein the photoelectric conversion component is located on a side of the organic electroluminescence component away from the base substrate; and
   the array substrate further comprises:
   a thermoelectric/piezoelectric conversion component, located between the photoelectric conversion component and the organic electroluminescence component, wherein the thermoelectric/piezoelectric conversion component is configured to convert thermal energy emitted by the photoelectric conversion component and pressure of the thermoelectric/piezoelectric conversion component into electric energy, and the thermoelectric/piezoelectric conversion component and the organic electroluminescence component are insulated with each other.

4. The array substrate according to claim 3, wherein positive projection of the thermoelectric/piezoelectric conversion component on the base substrate coincides with positive projection of the photoelectric conversion component on the base substrate.

5. The array substrate according to claim 4, wherein the thermoelectric/piezoelectric conversion component comprises a first transparent electrode, a thermoelectric/piezoelectric material layer and a second transparent electrode arranged successively in a stackup manner, wherein the second transparent electrode is located on a side of the thermoelectric/piezoelectric material layer facing toward the photoelectric conversion component.

6. The array substrate according to claim 5, wherein the photoelectric conversion component comprises a poly-3-hexylthiophene layer, a zinc oxide layer and a third transparent electrode successively located on a side of the second transparent electrode away from the thermoelectric/piezoelectric material layer.

7. The array substrate according to claim 1, wherein the photoelectric conversion component is located between the base substrate and a layer where the organic electroluminescence component is located, and the photoelectric conversion component is configured to convert light of the first waveband and the second waveband emitted by the organic electroluminescence component and irradiating in a direction of the base substrate.

8. The array substrate according to claim 7, further comprising:
   a pixel defining layer for defining an area where each organic electroluminescence component is located;
   wherein the pixel defining layer has a groove at a position corresponding to the photoelectric conversion component on a face away from the base substrate, a side of the groove comprises a light guiding layer, and the groove is configured for guiding light from the organic electroluminescence component irradiating the light guiding layer and light from outside irradiating a bottom of the groove to the photoelectric conversion component; and the photoelectric conversion component is further configured to convert the light guided out through the groove and the received light from outside into electric energy.

9. The array substrate according to claim 8, wherein a cross section of the groove perpendicular to a direction of the base substrate is a trapezoid structure with a wide top and a narrow bottom.

10. The array substrate according to claim 9, wherein an included angle between a side of the groove and a surface of the pixel defining layer away from the base substrate is 10 to 80 degrees.

11. The array substrate according to claim 8, wherein
depth of the groove is two-thirds of thickness of the pixel defining layer;
a material of the light guiding layer is a metal with a reflective property; and
positive projection of the groove on the base substrate coincides with positive projection of the photoelectric conversion component on the base substrate.

12. The array substrate according to claim 7, further comprising:
a transistor layer located between the base substrate and a layer where the organic electroluminescence component is located, wherein the photoelectric conversion component is located between the base substrate and the transistor layer.

13. The array substrate according to claim 2, wherein the photoelectric conversion component is located on a side of the organic electroluminescence component away from the base substrate, and the photoelectric conversion component is configured to convert the light of the second waveband emitted by the organic electroluminescence component and irradiating a display side into electric energy.

14. The array substrate according to claim 1, further comprising:
a first insulating layer and wiring located on a side of the fifth transparent electrode away from the N-type semiconductor layer;
wherein the first insulating layer covers side surfaces of the fourth transparent electrode, the P-type semiconductor layer, the intrinsic semiconductor layer, the N-type semiconductor layer and the fifth transparent electrode that are respectively perpendicular to the base substrate; and
the wiring is connected to the fifth transparent electrode through a via hole penetrating through the first insulating layer.

15. The array substrate according to claim 13, further comprising:
a packaging layer, arranged between the organic electroluminescence component and the photoelectric conversion component.

16. The array substrate according to claim 1, wherein the array substrate further comprises:
a touch component located at a gap of each organic electroluminescence component; and
the touch component comprises a first touch electrode, a second insulating layer and a second touch electrode arranged in a stackup manner.

17. The array substrate according to claim 16, wherein, the touch component is located on a side of the organic electroluminescence component away from the base substrate; when the photoelectric conversion component is located on the side of the organic electroluminescence component away from the base substrate, the first touch electrode and the fourth transparent electrode are arranged in a same layer, the first insulating layer is reused as the second insulating layer, and the second touch electrode and the wiring are arranged in a same layer.

18. A display panel, comprising an array substrate and a protection cover plate, wherein the array substrate comprises:
a base substrate;
a plurality of organic electroluminescence components, arranged on the base substrate in an array, wherein a luminescent spectrum of each organic electroluminescence component comprises a first waveband and a second waveband, the first waveband is determined by an emission peak of the luminescent spectrum, and is configured to determine brightness and tone purity of light emitted by the organic electroluminescence component; and
at least one photoelectric conversion component, corresponding to the organic electroluminescence component, and at least configured to convert light of the second waveband emitted by the corresponding organic electroluminescence component into electric energy;
wherein the photoelectric conversion component comprises a fourth transparent electrode, a P-type semiconductor layer, an intrinsic semiconductor layer, an N-type semiconductor layer and a fifth transparent electrode arranged in a stackup manner;
wherein a material of the intrinsic semiconductor layer corresponding to the organic electroluminescence component emitting red light is amorphous silicon; a material of the intrinsic semiconductor layer corresponding to the organic electroluminescence component emitting green light is amorphous silicon doped with $5*10^{14}$ carbon particles; and a material of the intrinsic semiconductor layer corresponding to the organic electroluminescence component emitting blue light is amorphous silicon doped with $9*10^{13}$ carbon particles.

* * * * *